United States Patent
Choi et al.

(10) Patent No.: US 6,239,009 B1
(45) Date of Patent: May 29, 2001

(54) FLASH MEMORY DEVICE AND METHOD FOR MANUFACTURING THE SAME

(75) Inventors: Jong Moo Choi; Sung Ryul Kim; Young Keun Park, all of Chungcheongbuk-do (KR)

(73) Assignee: Hyundai Electronics Industries Co., Ltd.

( * ) Notice: Subject to any disclaimer, the term of this patent is extended or adjusted under 35 U.S.C. 154(b) by 0 days.

(21) Appl. No.: 09/409,677

(22) Filed: Sep. 30, 1999

Related U.S. Application Data

(62) Division of application No. 08/911,351, filed on Aug. 7, 1997, now Pat. No. 5,986,303.

(30) Foreign Application Priority Data

Sep. 2, 1996 (KR) .................................................. 96/37838

(51) Int. Cl.[7] .............................................. H01L 21/3205
(52) U.S. Cl. ........................ 438/588; 438/257; 438/211; 438/593; 438/594
(58) Field of Search ................................... 438/587, 588, 438/591, 592, 593, 594, 201, 211, 257, 263, 264, 266

(56) References Cited

U.S. PATENT DOCUMENTS

| | | |
|---|---|---|
| 4,331,968 * | 5/1982 | Gosney, Jr. et al. ............ 365/185.14 |
| 4,546,538 | 10/1985 | Suzuki . |
| 4,998,220 * | 3/1991 | Eitan et al. ..................... 365/185.14 |
| 5,036,378 | 7/1991 | Lu et al. . |
| 5,070,032 | 12/1991 | Yuan et al. . |
| 5,364,805 | 11/1994 | Taura et al. . |
| 5,661,053 * | 8/1997 | Yuan ................................... 438/257 |
| 5,712,719 | 1/1998 | Yuan . |

FOREIGN PATENT DOCUMENTS

0123456-A2 * 1/2000 (EP) .................................... 100/100

* cited by examiner

Primary Examiner—Stephen D. Meier
Assistant Examiner—Maria Guerrero
(74) Attorney, Agent, or Firm—Fleshner & Kim, LLP

(57) ABSTRACT

A flash memory device has improved erasable characteristics and device reliability. The flash memory device includes a semiconductor substrate and heavily doped impurity regions formed spaced apart from one another by a predetermined distance in the semiconductor substrate in a first direction. First and second isolation regions are formed spaced apart from each other by a second predetermined distance on the semiconductor substrate, in a second direction which is preferably at a right angle to the first direction. Each of the floating gates are formed between the first and second isolation regons and between the heavily doped impurity regions. The control gate lines are formed between the first and second isolation regions, and over the floating gates in the same direction as the first and second isolation regions. An erase gate line is formed to have a narrower width than the floating gate, and is formed over the floating gate, preferably at a right angle to the control gate line.

20 Claims, 20 Drawing Sheets

000# FLASH MEMORY DEVICE AND METHOD FOR MANUFACTURING THE SAME

This application is a Divisional of application Ser. No. 08/911,351 filed Aug. 7, 1997, now U.S. Pat. No. 5,986,303.

BACKGROUND OF THE INVENTION

1. Field of the Invention

The present invention relates to a memory device and, more particularly, to a flash memory device and a method for manufacturing the same.

2. Background of the Related Art

General memory devices are divided into a read only memory (hereinafter referred to as ROM) and a random access memory hereinafter referred to as RAM). ROMs are divided into a mask ROM and a programmable ROM (PROM). In a mask ROM, a program data is inputted into a mask in advance to program the ROM. In a PROM, a chip is fabricated and mounted and then a ROM is programmed.

A PROM is again divided into an erasable programmable read only memory (EPROM) and an electrically erasable programmable read only memory (EEPROM). In an EPROM, inputted data can be erasable by means of ultraviolet ray. In an EEPROM, inputted data can be electrically erasable.

In a flash memory device of a three layered gate type, an erase gate is formed in an EEPROM cell so that inputted data may be electrically erasable. Also, in a flash memory device of a two layered gate type, an electric field is emitted toward a source.

FIG. 1a is a plan view of a related art flash memory device, FIG. 1b is a cross-sectional view showing the structure of the related art flash memory device, taken along line I–I' of FIG. 1a, FIG. 1c is a cross-sectional view showing the structure of the related art flash memory device, taken along line II–II' of FIG. 1a, and FIG. 1d is an equivalent circuit diagram of FIG. 1a.

A related art flash memory device, as shown in FIGS. 1a to 1c, includes a plurality of buried heavily doped impurity regions 2 spaced away from one another by a predetermined distance by implanting heavily n+ type impurity ions into a p-type semiconductor substrate 1. A plurality of isolation oxide layers 3 is formed at a right angle to the plurality of the buried heavily doped impurity regions 2. First sidewall spacers 3a are formed on both sides of each of the isolation oxide layers 3, and a gate oxide layer 4 is formed on the entire surface of the semiconductor substrate 1 exclusive of the isolation oxide layers 3 and the first sidewall spacers 3a.

Each of the floating gates 5b overlaps each of the buried heavily doped impurity regions 2 by a predetermined area, and a first interlevel insulating film 6 is formed on the entire surface of the semiconductor substrate 1 inclusive of the floating gates 5b. A control gate line 7a and a cap oxide layer 8 are successively formed on the first interlevel insulating film 6 and have a narrower width than the floating gate 5b. Second sidewall spacers 9 are formed on both sides of the control gate line 7a and the cap oxide layer 3, and an erase gate line 11a overlapping two of the control gate lines 7a. One erase gate line 11a is designed to erase electrons of the floating gate 5b formed along the erase gate line 11a.

For programming a flash memory of three layered polysilicons 5b, 7a, and 11a, a voltage of 7V is applied to the buried heavily doped impurity region 2, a voltage of 12 V is applied to the control gate 7a, and a voltage 0V is applied to the buried heavily doped impurity region 2, which is neighboring with the buried heavily doped impurity region 2 used as the drain. Channel hot electrons, which are generated by high electric field at the drain of a channel, pass over potential barrier of the gate oxide layer 4 so as to be injected to the floating gate 5b. As a result, a threshold voltage of a memory device is increased.

For erasing inputted data, a high voltage of between 12V–24V is applied to the erase gate 11a and a voltage of 0V is applied to the control gate 7a and the floating gate 5b. Accordingly, a high electric field is generated due to a sharp geometrical structure of the floating gate 5b formed on the isolation oxide layer 3 and electrons travel to the erase gate 11a, thus generating an electron tunneling known as "Fowler Nordheim tunneling" from the floating gate 5b to the erase gate 11a.

In other words, the floating gate 5b loses electrons and the threshold voltage of the memory device is decreased. The arrow shown in FIG. 1c indicates the electron movement direction during the erase operation. Accordinaly, a threshold voltage of a device is controlled and inputted data is maintained. For reading data, voltages of 5V, 1V, and 0V are applied to the control gate, the drain, and the source and the erase gate, respectively, so that changes of potential of a bitline connected to the drain, or changes of current are sensed, depending on a difference of threshold voltages according to stored data, thereby reading the stored data.

FIGS. 2a through 2i are cross-sectional views showing process steps of the related art method for manufacturing the flash memory device, taken along line I–I' of FIG. 1a. FIGS. 3a through 3i are cross-sectional views showing process steps of the related art method for manufacturing the flash memory deice, taken alone line II–II' of FIG. 1a.

First, heavily n+ impurity ions are selectively implanted into a p-type semiconductor device 1 so as to form a plurality of buried heavily doped impurity regions 2 used as source and drain, as shown in FIGS. 2a and 3a. At this time, the impurity regions 2 are spaced away from one another by a prescribed distance. An oxide layer is formed on the semiconductor substrate 1 and then is selectively patterned with a photolithography process and an photo etching process, thus forming a plurality of isolation oxide layers 3 at a right angle to the buried heavily doped impurity regions 2. Next, first sidewall spacers 3a are formed on both sides of each of the isolation oxide layers 3.

Referring to FIGS. 2b and 3b, a gate oxide layer 4 is formed on the entire surface of the semiconductor substrate 1 exclusive of the isolation oxide layers 3 and the first sidewall spacers 3a. Then, on the entire surface, a polysilicon layer 5 which will be used as a floating gate is deposited.

Referring to FIGS. 2c and 3c, a photoresist $PR_1$ is coated on the polysilicon layer 5 and then is subjected to exposure and development to pattern and to define the placement of a floating gate line. With the photoresist pattern $PR_1$ serving as a mask, the polysilicon layer 5 is selectively etched, and thus forming a floating gate line 5a. At this time, one edge of the floating gate line 5a overlaps the heavily doped impurity region 2 used as a drain by a predetermined area. The floating gate line 5a is offset from the heavily impurity region 2 used as a source.

Referring, to FIGS. 2d and 3d, the remaining photoresist film $PR_1$ is removed. Subsequently, a first interlevel insulating film 6, a polysilicon layer 7 used as a control gate, a cap oxide layer 8, and a photoresist film $PR_2$ are successively formed on the entire surface of the semiconductor substrate 1 inclusive of the floating gate line 5a, the isolation oxide layer 3, and the first sidewall spacers 3a. Thereafter, the photoresist film PR$_2$ is subjected to exposure and development to be patterned, thus defining a placement of a control gate line.

Referring to FIGS. 2e and 3e, with the photoresist pattern PR$_2$, serving as a mask, the cap oxide layer 8, the polysilicon layer 7, and the first interlevel insulating film 6 are selectively removed to form a control gate line 7a. At this time, the control gate line 7a is located between the isolation oxide layers 3 in the same direction as the isolation oxide layers 3. Both edges of the control gate line 7a overlap the isolation oxide layers 3 by a predetermined area.

Referring to FIGS. 2f and 3f, the remaining photoresist film PR$_2$ is removed. An oxide layer used as sidewall spacers is deposited on the entire surface of the semiconductor substrate 1 and then is etched-back to form second sidewall spacers 9 on both sides of the cap oxide layer 8, the control gate line 7a, and the interlevel insulating layer 6.

Referring to FIGS. 2g and 3g, with the second sidewall spacers 9 serving as a mask, the floating gate line 5a is etched to form a plurality of floating gates 5b.

Referring to FIGS. 2h and 3h, on the entire surface inclusive of the cap oxide layer 8 and the second sidewall spacers 9, a second interlevel insulating film 10, a polysilicon layer 11 used as an erase gate, and a photoresist film PR$_3$, which is then subjected to exposure and development to be patterned, thus defining a placement of an erase gate line, are successively formed. At this time, the photoresist film PR$_3$ is patterned to overlaps two of the control gate lines 7a.

Referring to FIGS. 2i and 3i, with the photoresist pattern PR$_3$ serving as a mask, the polysilicon layer 11 and the second interlevel insulating film 10 are selectively etched to form an erase gate line 11a, which overlaps two of the control gate lines 7a, in the same direction as the control gate lines 7a. Then, the remaining photoresist film PR$_3$ is removed, thereby finishing the conventional flash memory device.

Such a related art flash memory device and a related art method for manufacturing the same have various disadvantages. First, since a channel between source and drain regions is used as both a control gate line and a floating gate, a high integration and high speed operations are difficult to achieve. Second, for programming, a channel hot carrier is utilized, so that a gate oxide layer is damaged and thus limitations are given to a high programming frequency.

The above references are incorporated by reference herein where appropriate for appropriate teachings of additional or alternative details, features and/or technical background.

SUMMARY OF THE INVENTION

Therefore, the present invention is directed to a flash memory device and a manufacturing method thereof that substantially obviate one or more of problems due to limitations and disadvantages of the related art.

An object of the invention is to achieve a high integration.

Another object of the present invention is to achieve high speed operation.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the flash memory device includes a semiconductor substrate; heavily doped impurity regions formed to be spaced away from one another by a predetermined distance in the semiconductor substrate, in one direction; first and second isolation regions formed on the semiconductor substrate at a right angle to the heavily doped impurity regions; floating gates each formed between the first and second isolation regions and between the heavily doped impurity regions; control gate lines formed on the floating gates in the same direction as the first and second isolation regions; and an erase gate line formed over the floating gate at a right angle to the control gate line.

The present invention may be achieved in whole or in part by a semiconductor device including a semiconductor substrate; impurity regions formed to be spaced away from one another by a first prescribed distance in the semiconductor substrate, in a first direction; first and second isolation regions formed on the semiconductor substrate in a second direction which is at a substantially perpendicular angle to the first direction and spaced away from each other by a second prescribed distance; floating gates, each formed between the first and second isolation regions and between the impurity regions; control gate lines, each formed between said first and second isolation regions, and overlapping said floating gates, said control gate lines being formed in the second direction; and an erase gate line formed over the floating gate in the first direction.

In another aspect of the invention, there is provided a method for manufacturing a flash memory device including the steps of forming heavily doped impurity regions which are spaced away from one another by a predetermined distance on a semiconductor substrate, in one direction; forming isolation regions including first and second insulating layers and sidewall spacers on predetermined portions of the semiconductor substrate, at a right angle to the heavily doped impurity regions; forming and selectively patterning a first conductive layer on the entire surface of the semiconductor substrate, so as to form a floating gate line between the heavily doped impurity regions; forming and selectively patterning a second conductive layer on the entire surface of the semiconductor substrate inclusive of the floating gate line, so as to form control gate lines between the isolation regions; selectively removing the floating gate line on the isolation regions, so as to form floating gates; removing the second insulating layer of every other isolation region; forming and selectively patterning a third conductive layer on the entire surface of the semiconductor substrate, so as to form an erase gate line over the floating gates, at a right angle to the control gate lines.

The present invention may be achieved in whole or in part by a method for manufacturing a flash memory device, the method including the steps of: forming doped impurity regions spaced apart from one another by a first prescribed distance in a semiconductor substrate, in a first direction; forming isolation regions formed to be spaced away from one another by a second prescribed distance in a second direction, which is at a substantially perpendicular angle to the first direction; forming floating gates between the doped impurity regions; forming control gate lines between the isolation regions; removing partial portions of the every other isolation region; forming an erase gate line over the floating gates in the first direction.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1b is a cross-sectional view showing the structure of the related art flash memory device, taken along line I–I' of FIG. 1a;

FIG. 1c is a cross-sectional view showing the structure of the related art flash memory device, taken along line II–II' of FIG. 1a;

FIG. 1d is an equivalent circuit diagram of FIG. 1a;

FIGS. 2a to 2i are cross-sectional views showing process steps of a method for manufacturing the related art flash memory device, taken along line I–I' of FIG. 1a;

FIGS. 3a to 3i are cross-sectional views showing process steps of the method for manufacturing the related art flash memory device, taken along line II–II' of FIG. 1a;

FIG. 4b is a cross-sectional view showing the structure of the flash memory device according to the invention, taken along line I–I' of FIG. 4a;

FIG. 4c is a cross-sectional view showing the structure of the flash memory device according to the invention, taken along line II–II' of FIG. 4a;

FIG. 4d is an equivalent circuit diagram of the flash memory device of FIG. 4a;

FIGS. 5a to 5l are cross-sectional views showing process steps of a method for manufacturing the flash memory device according to a preferred embodiment of the invention, taken along line I–I' of FIG. 4a; and FIGS. 6a to 6l are cross-sectional views showing process steps of the method for manufacturing the flash memory device according to the preferred embodiment of the invention, taken along line II–II' of FIG. 4a.

DETAILED DESCRIPTION OF PREFERRED EMBODIMENTS

Figure 1A:
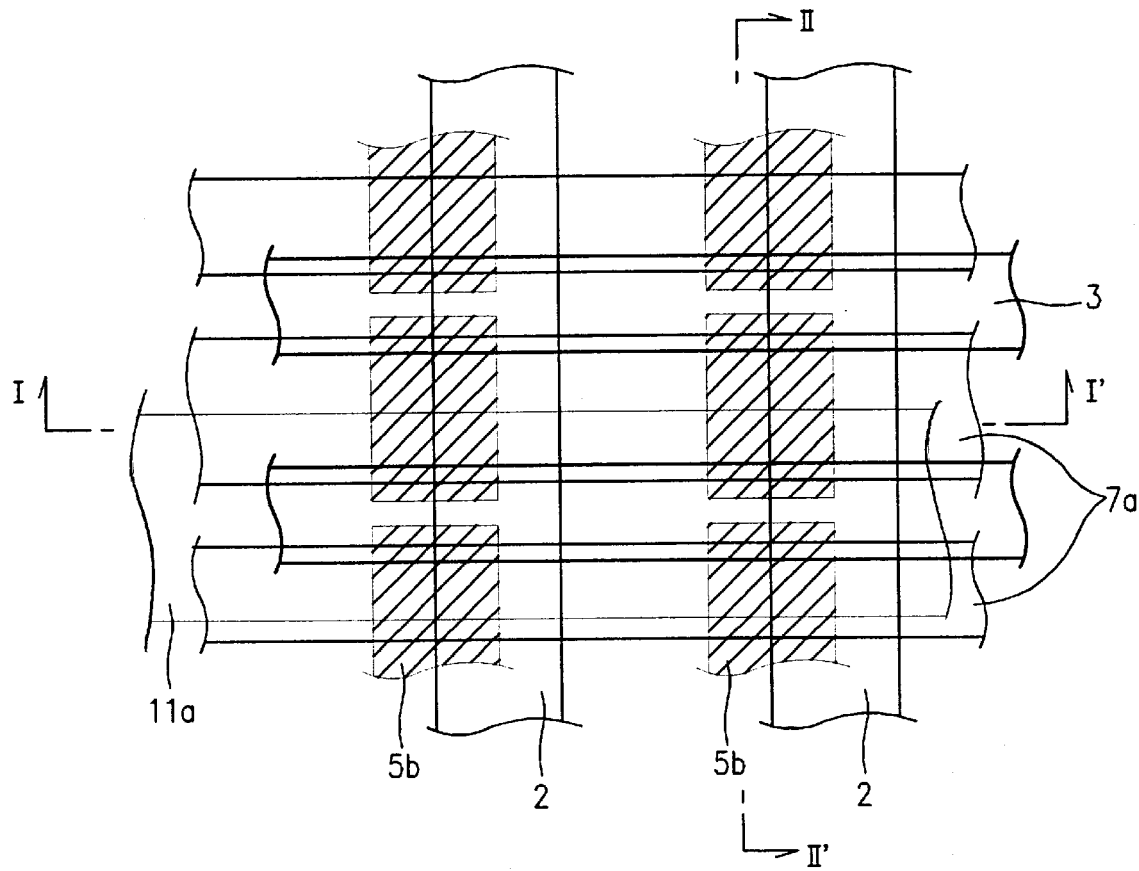
FIG. 1a is a plan view of a related art flash memory device.
Figure 1B:
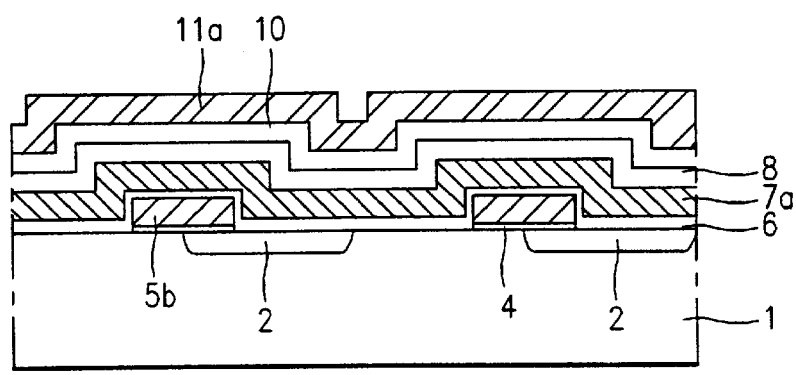
Figure 1C:
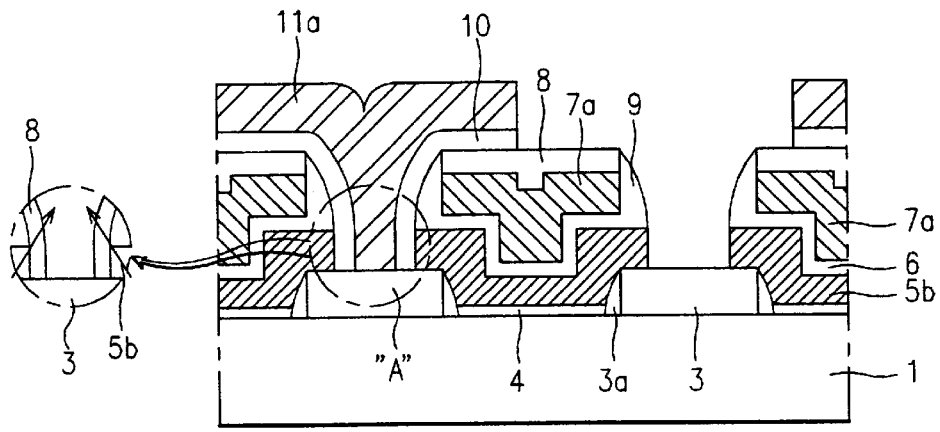
Figure 1D:
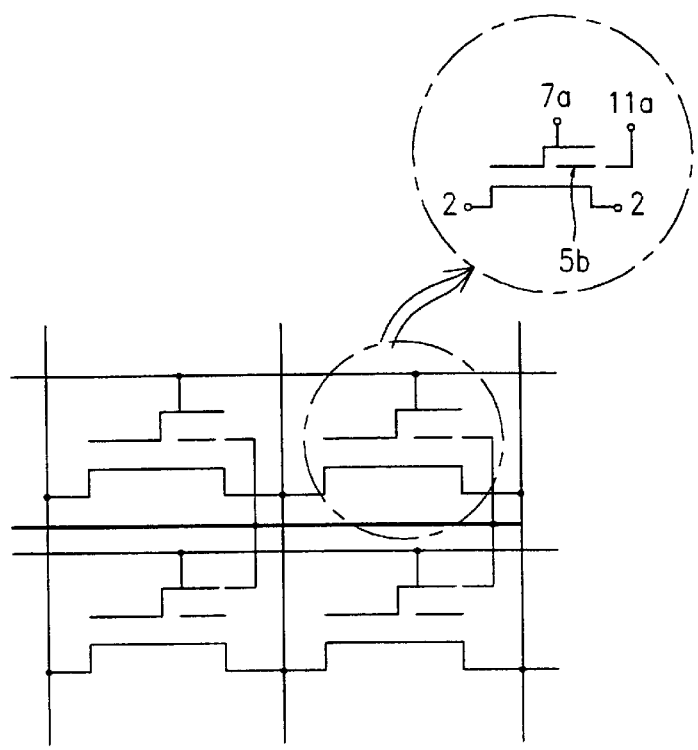
Figure 2A:
Figure 2B:
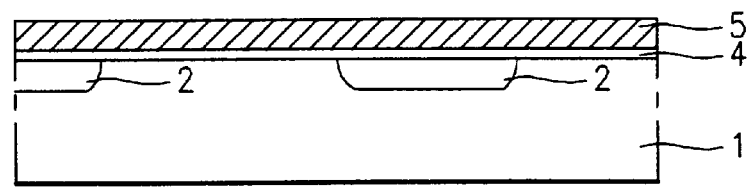
Figure 2C:
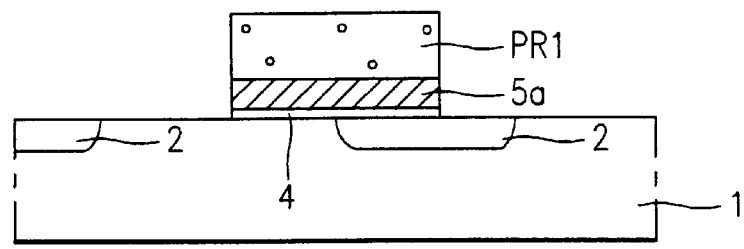
Figure 2D:
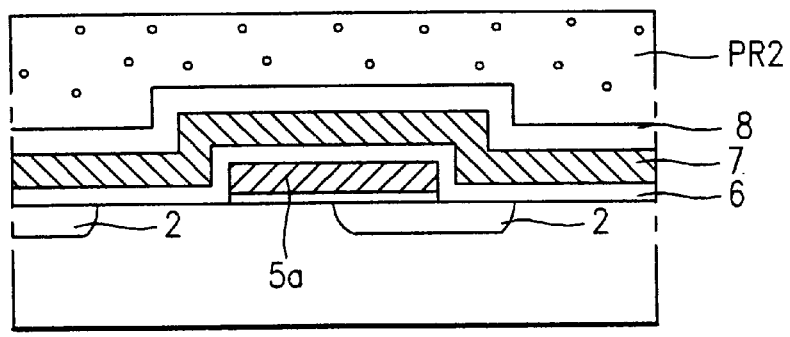
Figure 2E:
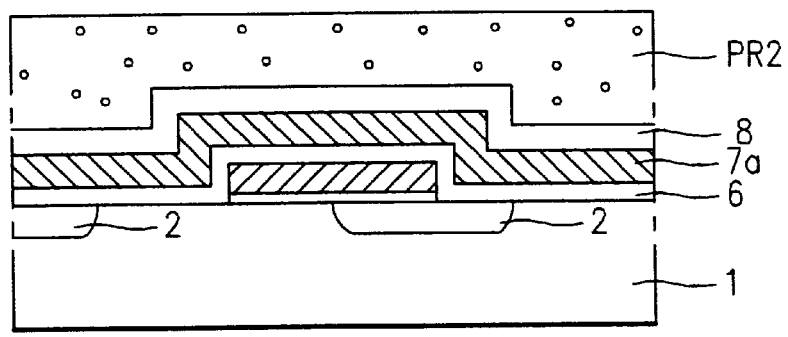
Figure 2F:
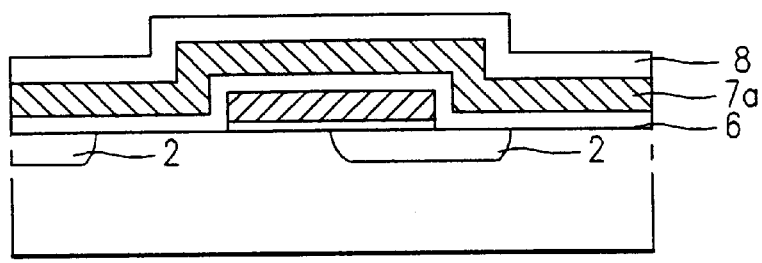
Figure 2G:
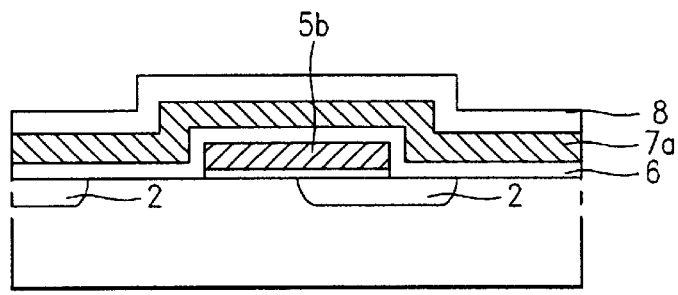
Figure 2H:
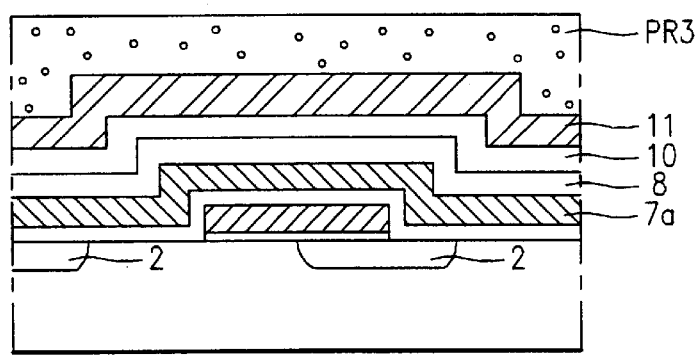
Figure 2I:
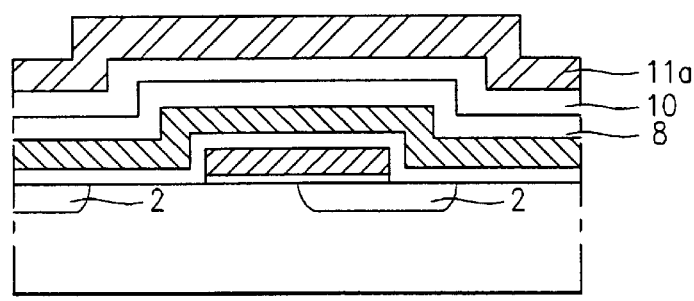
Figure 3A:
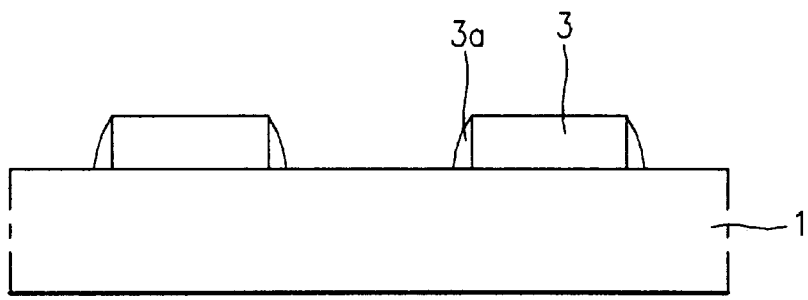
Figure 3B:
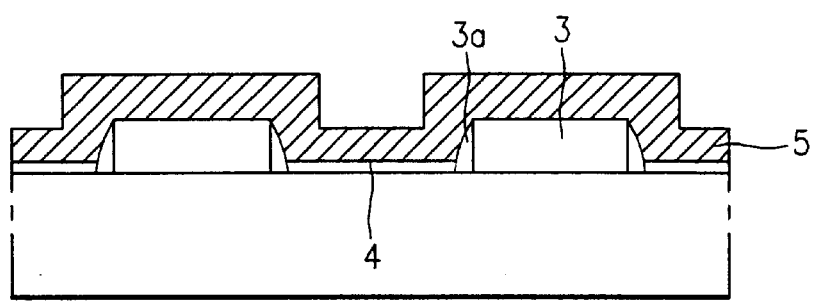
Figure 3C:
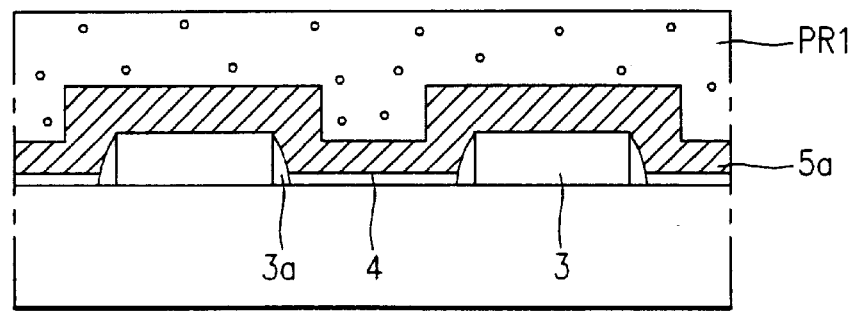
Figure 3D:
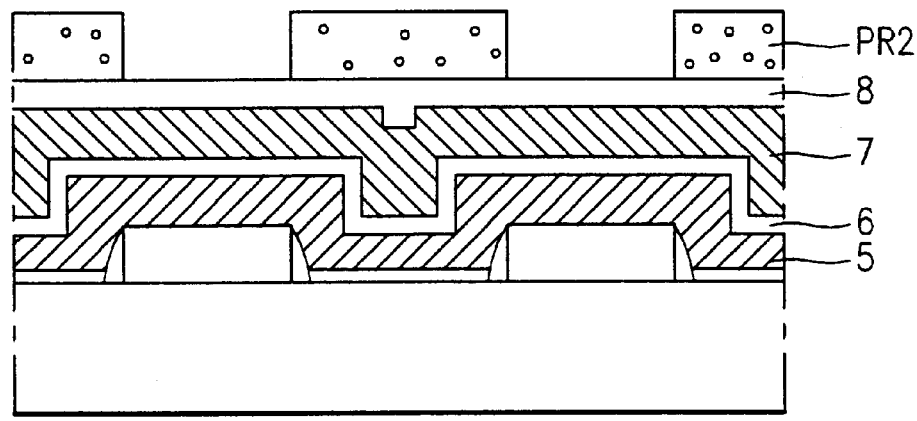
Figure 3E:
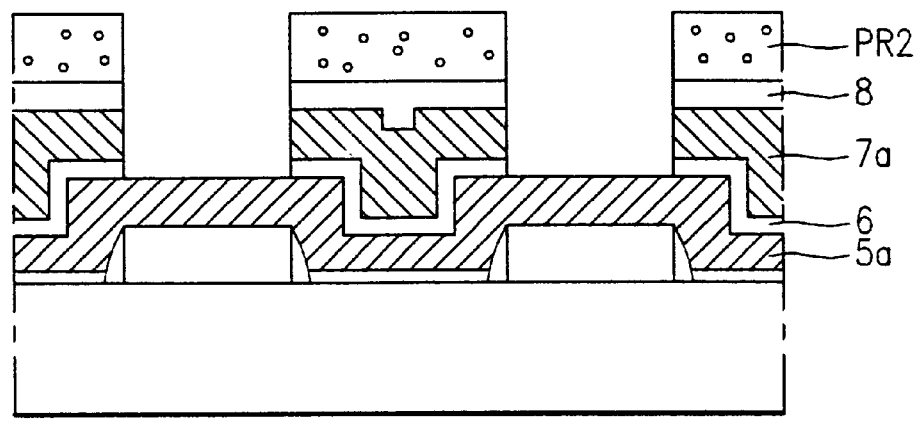
Figure 3F:
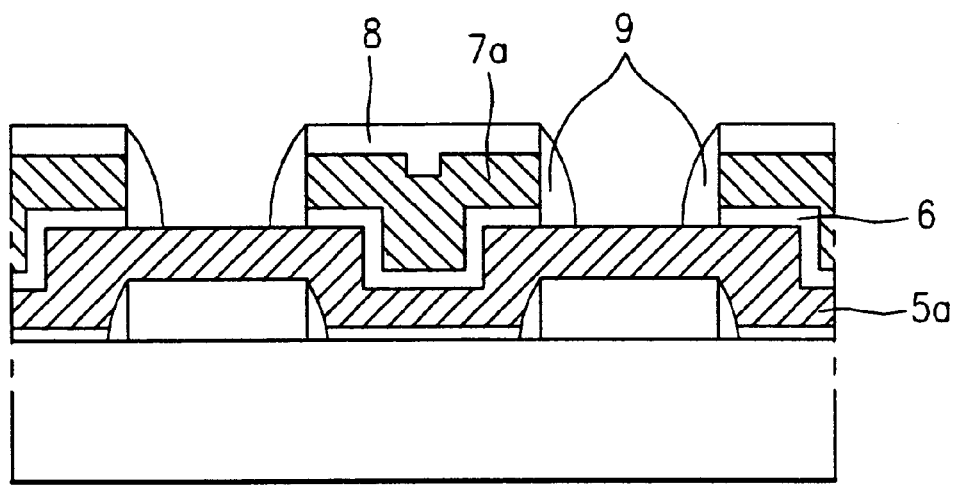
Figure 3G:
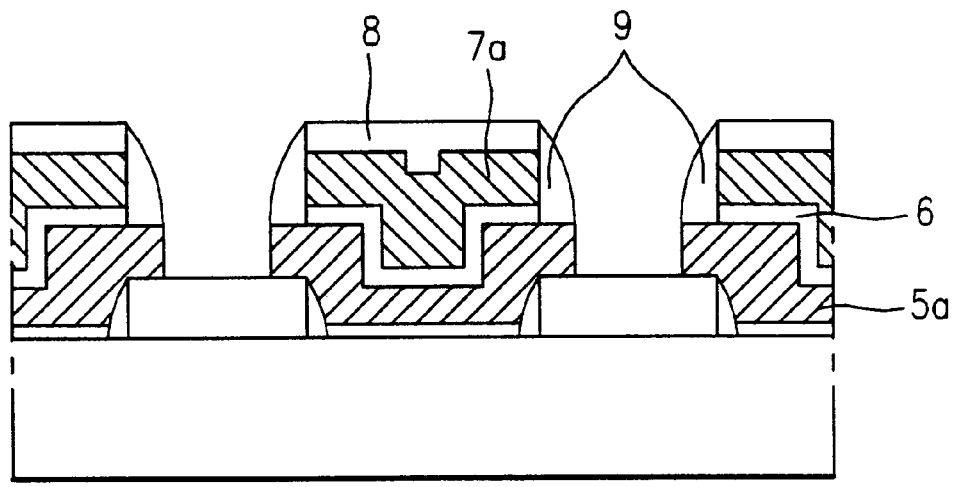
Figure 3H:
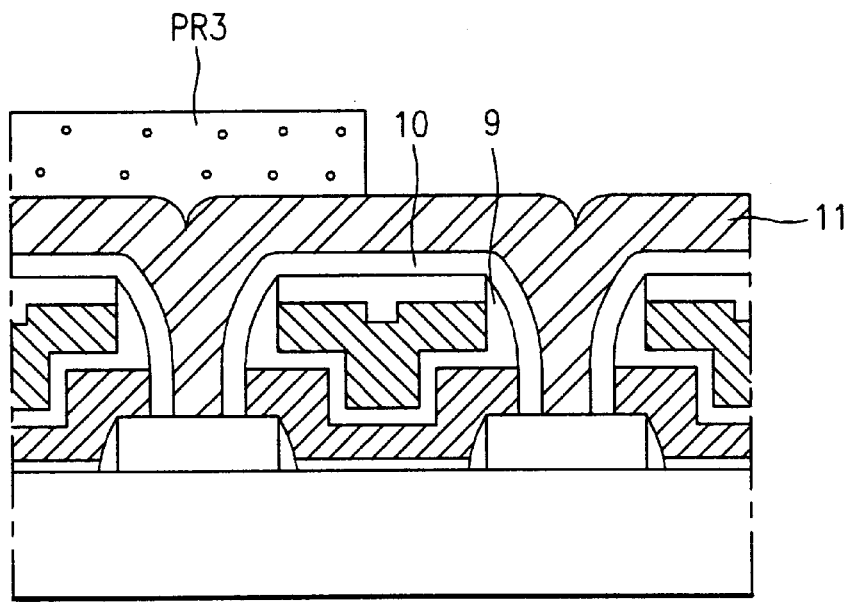
Figure 3I:
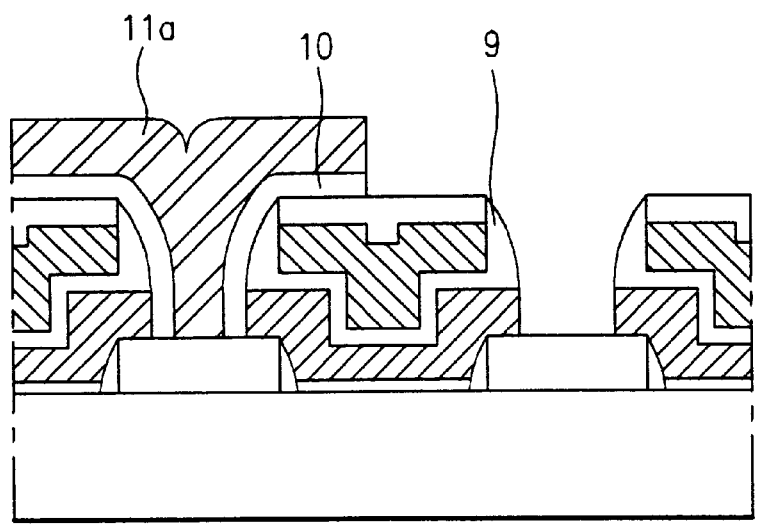
Figure 4A:
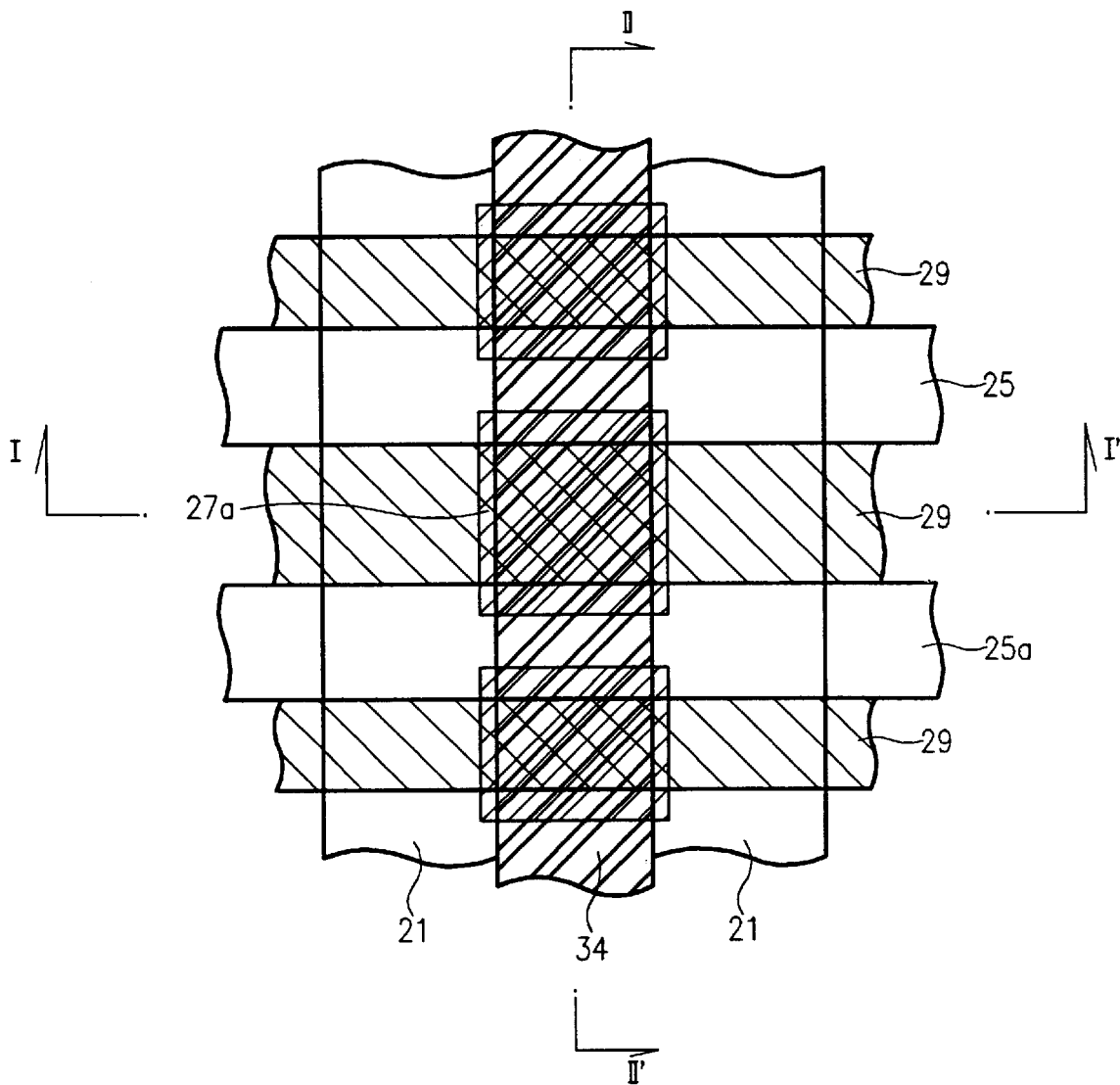
FIG. 4a is a plan view of a flash memory device according to the invention.
Figure 4B:
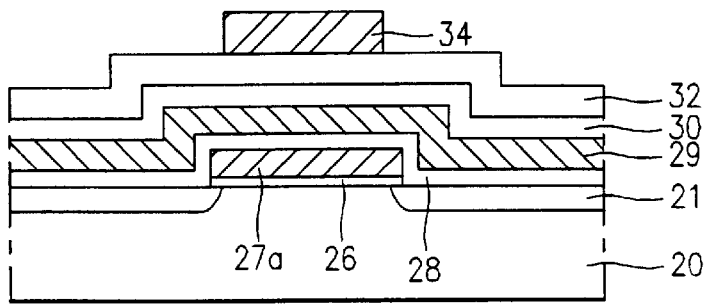
Figure 4C:
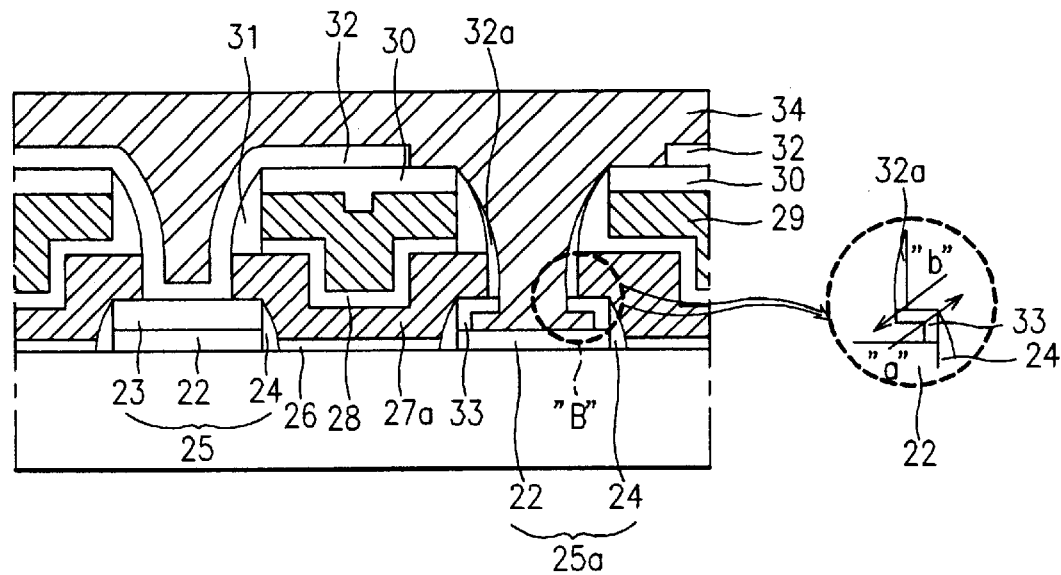
Figure 4D:
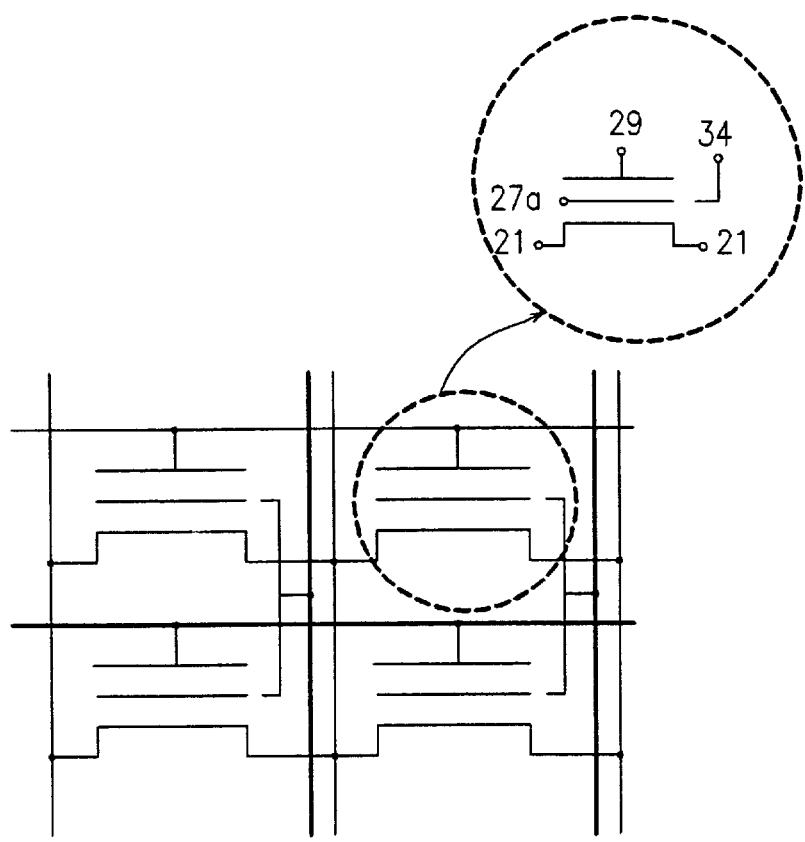

FIG. 4a is a plan view of a flash memory device according to the invention; FIG. 4b is a cross-sectional view showing the structure of the flash memory device according to the invention, taken along line I–I' of FIG. 4a; FIG. 4c is a cross-sectional view showing the structure of the flash memory device according to the invention, taken along line II–II' of FIG. 4a; and FIG. 4d is an equivalent circuit diagram of the flash memory device of FIG. 4a.

A flash memory device of the invention includes a plurality of heavily doped impurity regions 21 formed to be spaced away from one another by a first prescribed distance in a semiconductor substrate 20 in a first direction. First and second isolation regions 25 and 25a are formed spaced away from each other by a second prescribed distance on the semiconductor substrate, preferably at a right angle to the heavily doped impurity regions 21. Floating gates 27a, each formed between the first and second isolation regions 25 and 25a and between the heavily doped impurity regions 21, control gate lines 29 each formed over the floating gate 27a and between the first and second isolation regions 25 and 25a and an erase gate line 34 formed over the floating gate 27a, at a right angle to the control gate lines 29, and having a narrower width than the floating gate 27a.

The first isolation region 25 includes a first insulating layer 22 of an oxide, a second insulating layer 23 of a nitride, and first sidewall spacers 24 formed beside the layers 22 and 23. Unlike the first isolation region 25, the second isolation region 25a includes a first insulating layer 22 of an oxide, and sidewall spacers 24 formed both sides of the first insulating layer 22, but not a second insulating layer 23 of a nitride. Instead, an oxide layer 33 of the same height as the second insulating layer 23 of the first isolation region 22 is formed on the edge of the first insulating layer 22 of the second isolation region 25a and covering the first sidewall spacers 24 of the first isolation region 25a and on the exposed the floating gate 27a, which overlaps the second isolation regions 25a.

A gate oxide layer 26 is formed on the surface of the semiconductor substrate 20 between the first and second isolation regions 25 and 25a. The floating gate 27a overlaps the adjacent heavily doped impurity regions 21 by a predetermined area and also overlaps the adjacent first and second isolation regions 25 and 25a by a predetermined area. The control gate line 29 is formed to have a narrower width than the floating gate 27a. A first interlevel insulating film 28 is formed between the control gate line 29 and the floating gate 27a. A cap insulating layer 30 is formed on the control gate line 29. Second sidewall spacers 31 are formed on both sides of the layers 30, 29, and 28. At this time, the second insulating layer 32 is formed on the first isolation region 25 and partially overlaps the cap insulating layer 30. Third sidewall spacers 32a are formed on the second sidewall spacers 31 and on both sides of the floating gate 27a, over the second isolation region 25a.

FIG. 4d is an equivalent circuit diagram of the flash memory device of the invention. As shown in FIG. 4d, for programming, a voltage of about 0V is applied to the heavily doped impurity regions 21 used as source and drain regions, a voltage range of about 0V–12V is applied to the control gate line 29, and a voltage range of about –12V—0V is applied to the erase gate line 34. At this time, a high electric field is formed at the portion of "B", thus generating a Fowler Nordheim tunneling. Thus, programming is carried out. The arrow "a" indicates the traveling direction of electrons during programming. The electrons are injected to the floating gate 27a, such that the threshold voltage of the floating gate 27a is increased.

For erasing, a voltage of about 0V is applied to the heavily doped impurity regions 21 used as the source and drain, a voltage range of about –12V–0V to the control gate line 29, and a voltage range of about 0V–12V is applied to the erase gate line 34. At this time, the electrons of the floating gate 27a travel in the direction indicated by the arrow "b" at the portion "B" shown in FIG. 4c, thus decreasing the threshold voltage of the floating gate 27a.

Also, for reading stored data, a voltage range of about 1V–2V is applied to the heavily doped impurity region 21 used as the drain, a voltage of about 0V to the erase gate 34 and the heavily doped impurity region 21 used as the source, and a voltage range of about 2V–7V is applied to the control gate line 29, so that changes of current and changes of potential of the bitlines connected to the heavily doped impurity region 21 used as the drain are sensed depending on a difference of threshold voltages according to the stored data, thereby reading the stored data.

FIGS. 5a through 5l and 6a through 6l are cross-sectional views showing process steps of a method for manufacturing the flash memory device according to a preferred embodiment of the invention, taken along line I–I' and line II–II', respectively.

Figure 5A:
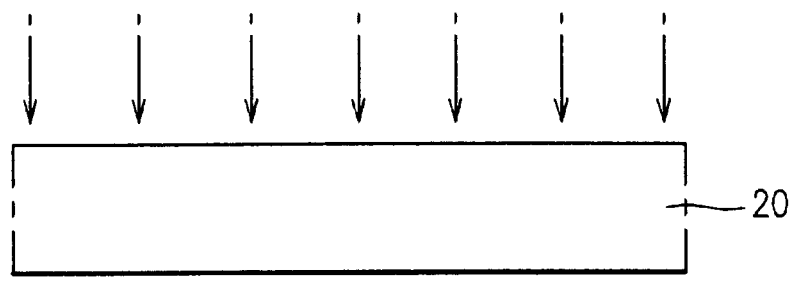
Figure 6A:
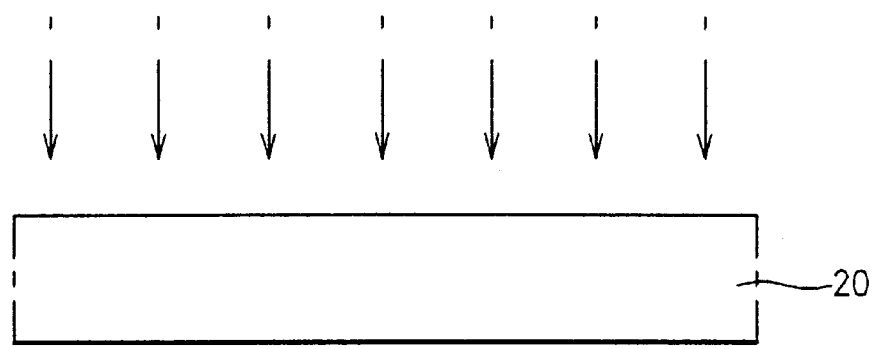

Referring initially to FIGS. 5a and 6a, an ion implantation process is performed into a semiconductor substrate 20, so as to increase a threshold voltage of a field transistor for device isolation.

Figure 5B:
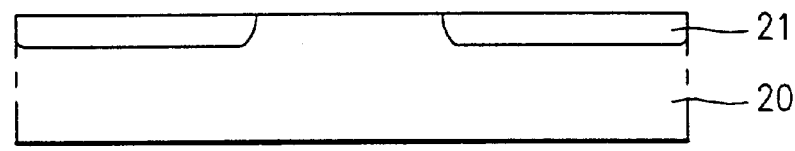
Figure 6B:

Referring to FIGS. 5b and 6b, impurity ions are selectively implanted into the semiconductor substrate 20, thus forming heavily doped impurity regions 21 used as source and drain regions. At this time, $n^+$ type ions are preferably used, such as arsenic (As) ions. An energy for As ion implantation is about 30–80 Kev, and an annealing temperature is about 850–950° C.

Figure 5C:
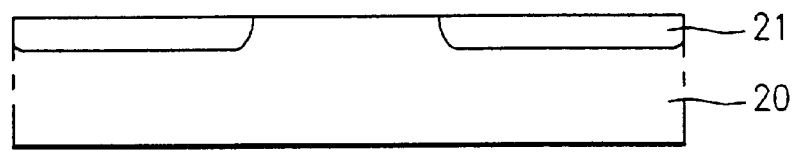
Figure 6C:
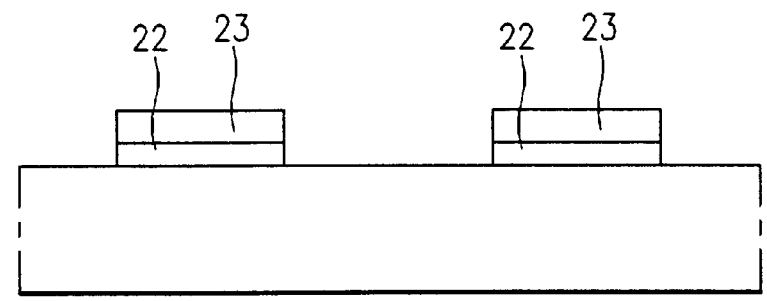

Referring to FIGS. 5c and 6c, first and second insulating layers 22 and 23 are successively formed on the entire surface of the semiconductor substrate 20, and then are selectively patterned with a photolithography and a photo etching process, so as to be spaced away from one another by a predetermined distance, preferably at a right angle to the heavily doped impurity regions 21. At this time, an oxide is deposited on the semiconductor substrate 20 with either a thermal oxidation process or a chemical vapor deposition (CVD) process, so as to form the first insulating layer 22. For the second insulating layer 23, a material having a different etch rate from the first insulating layer 22 is used. It is preferable to use a nitride layer as the second insulating layer 23. Alternatively, the first and second insulating layers 22 and 23 can be made of a nitride and an oxide, respectively.

Figure 5D:
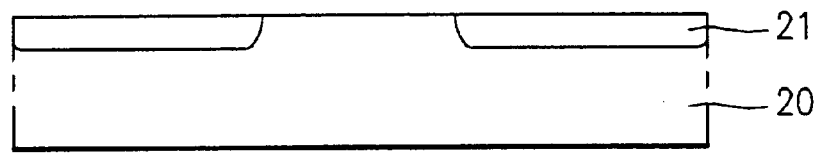
Figure 6D:
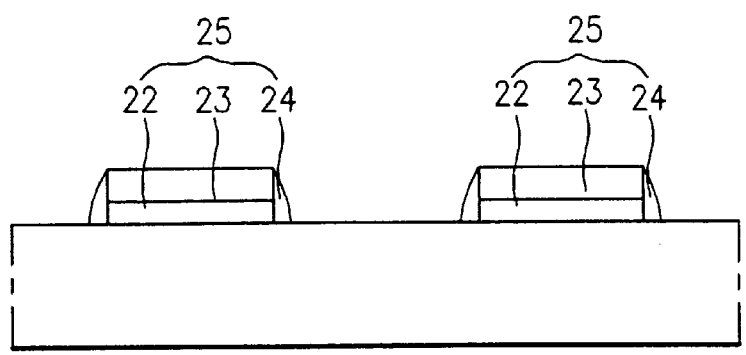

Referring to FIGS. 5d and 6d, an insulating layer is deposited on the entire surface of the semiconductor substrate 20 inclusive of the second insulating layer 23, and then is etched-back to form first sidewall spacers 24 on both sides of the first and second insulating layers 22 and 23. The first and second insulating layers 22 and 23 and the first sidewall spacers 24 constitute the first isolation region 25. The material used to form the first sidewall spacers 24 preferably has a different etch rate from the second insulating layer 23. That is, if the second insulating layer 23 is made of a nitride, the first sidewall spacers 24 are made of an oxide. If the second insulating layer 23 is made of an oxide, the first sidewall spacers 24 are made of a nitride.

Figure 5E:
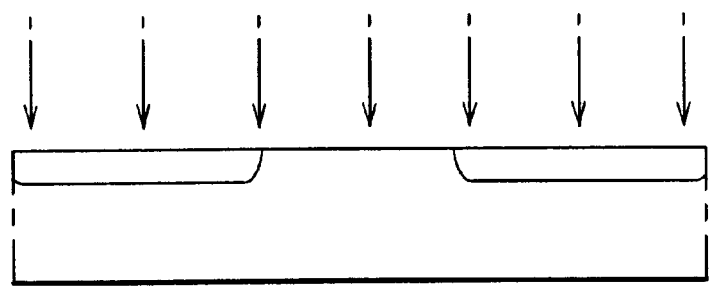
Figure 6E:
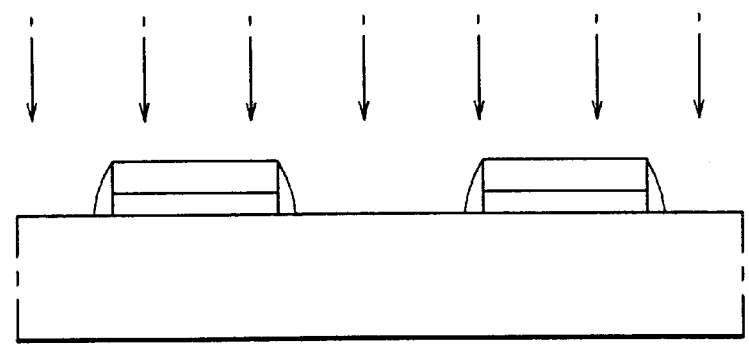

Referring to FIGS. 5e and 6e, an ion-implanting process is performed to increase a threshold voltage of the memory device.

Figure 5F:
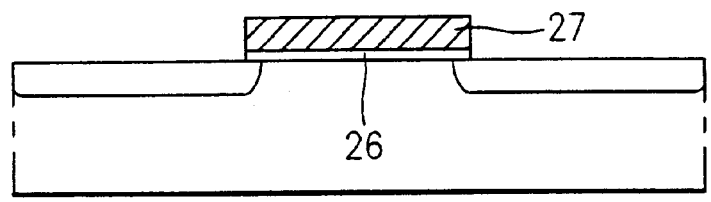
Figure 6F:
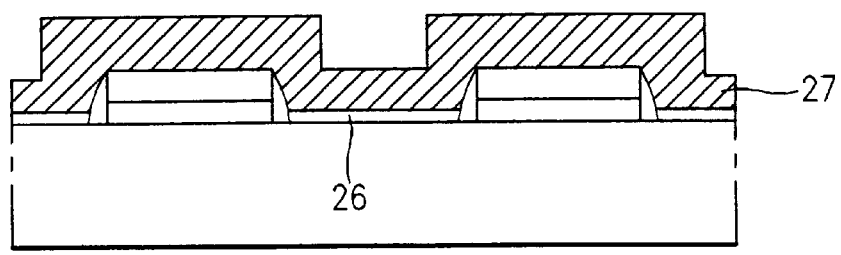

Referring to FIGS. 5f and 6f, a gate insulating layer 26 of an oxide is formed on the entire surface of the semiconductor substrate 20 between the first isolation regions 25. A polysilicon layer is deposited on the entire surface of the semiconductor substrate 20 inclusive of the gate insulating layer 26, and then is selectively patterned with a photolithography process and a photo etching process, thus forming a floating gate line 27 between the heavily doped impurity regions 21 in the same direction as the heavily doped impurity regions 21. At this time, the gate insulting layer 26, which is not located under the floating gate line 27, is etched, simultaneously. Both edges of the floating gate line 27 overlap the heavily doped impurity regions 21 used as the source and drain by a predetermined area.

The electrons are injected by means of an erase gate line 34, not by means of a channel hot electrons of the heavily doped impurity region 21 used as the source, so that the heavily doped impurity regions 21 and the floating gate 27a do not need any placement for off-set for programming the floating gate 27a.

Figure 5G:
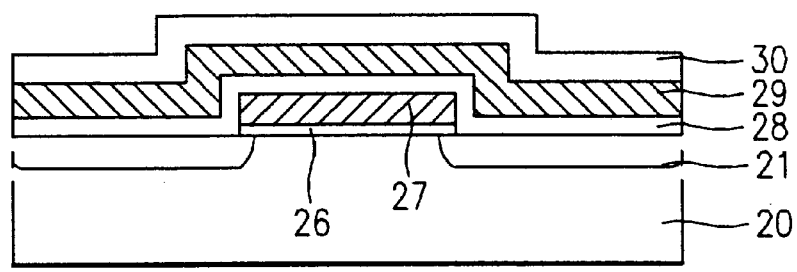
Figure 6G:
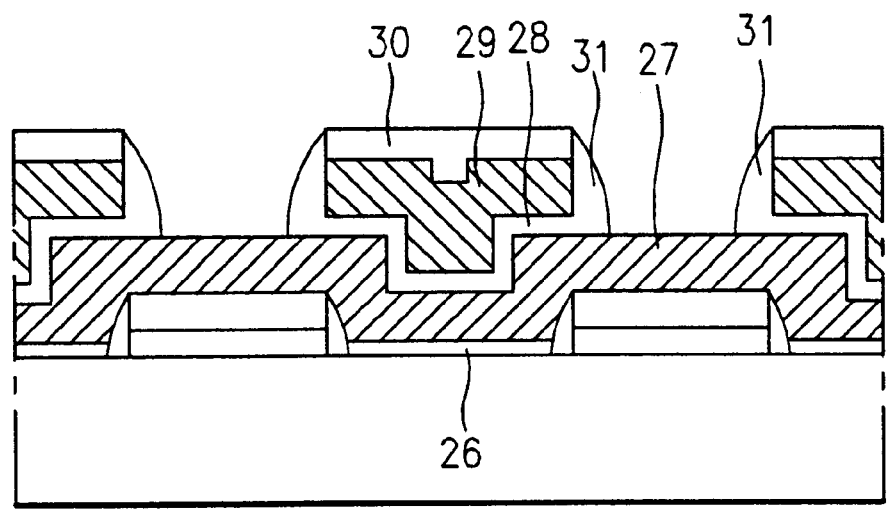

Referring, to FIGS. 5g and 6g, a first interlevel insulating film 28, a polysilicon layer used as a control gate, and a cap insulating layer 30 are successively formed on the entire surface of the semiconductor substrate 20 inclusive of the floating gate line 27 and the first isolation region 22, and then are all selectively patterned to form a plurality of control gate lines 29. At this time, the plurality of control gate lines 29 are formed to have a narrower width that the floating gate line 27, and have the same direction as the first isolation region 25.

Subsequently, an insulating layer is formed on the entire surface of the floating gate line 27 inclusive of the cap insulating layer 30, and then is etched-back preferably with a reactive ion etch (RIE) method, thus forming second sidewall spacers 31 on both sides of the cap insulting layer 30, the control gate line 29, and the first interlevel insulating layer 28.

Figure 5H:
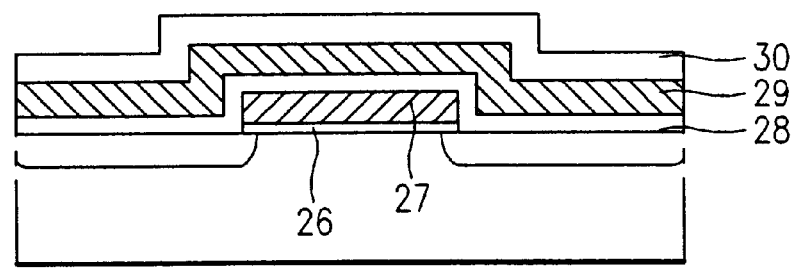
Figure 6H:
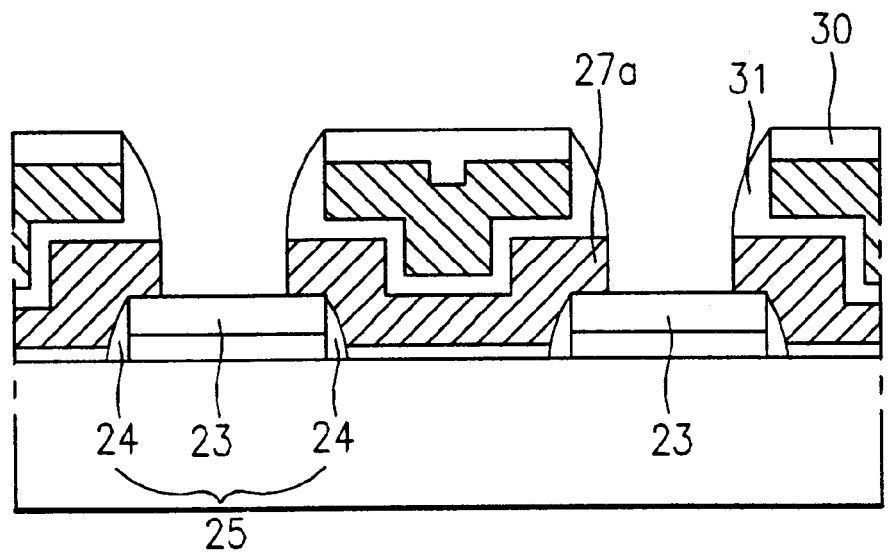

Referring to FIGS. 5h and 6h, with the cap insulating layer 30 and the second sidewall spacers 31 serving as a mask, the floating gate line 27 is selectively etched to form a plurality of floating gates 27a. At this time, the second insulating layer 23 is exposed.

Figure 5I:
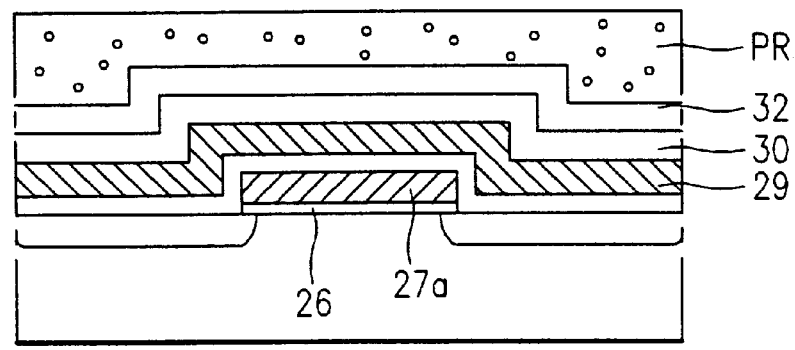
Figure 6I:
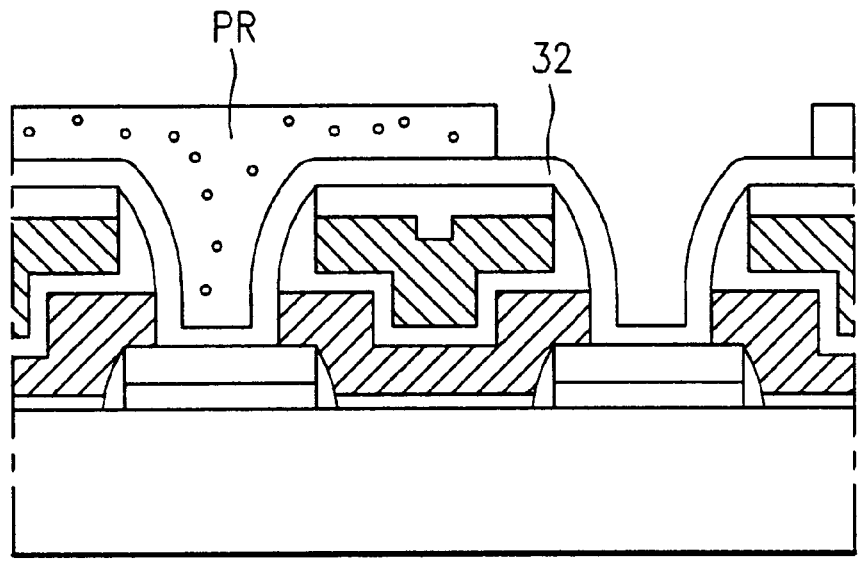

Referring to FIGS. 5i and 6i, a second interlevel insulating film 32 and a photoresist film PR are formed on the entire surface inclusive of the cap insulating layer 30, the second sidewall spacers 31, and the nitride film 23. Next, the photoresist film PR is subjected to exposure and development to be patterned so that the second interlevel insulating film 32 is exposed on every other first isolation region 25. At this time, the exposed second interlevel insulating film 37 has a wider width than the first isolation regions 25.

Figure 5J:
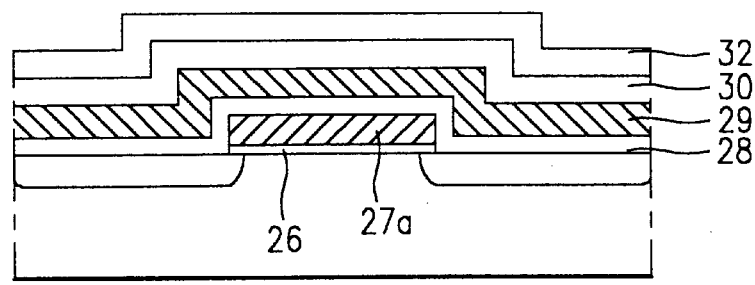
Figure 6J:
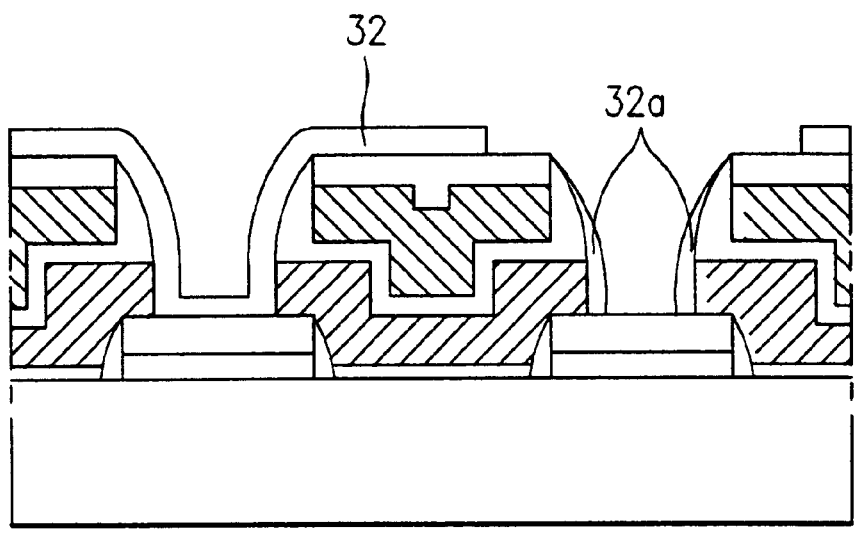
Figure 6K:
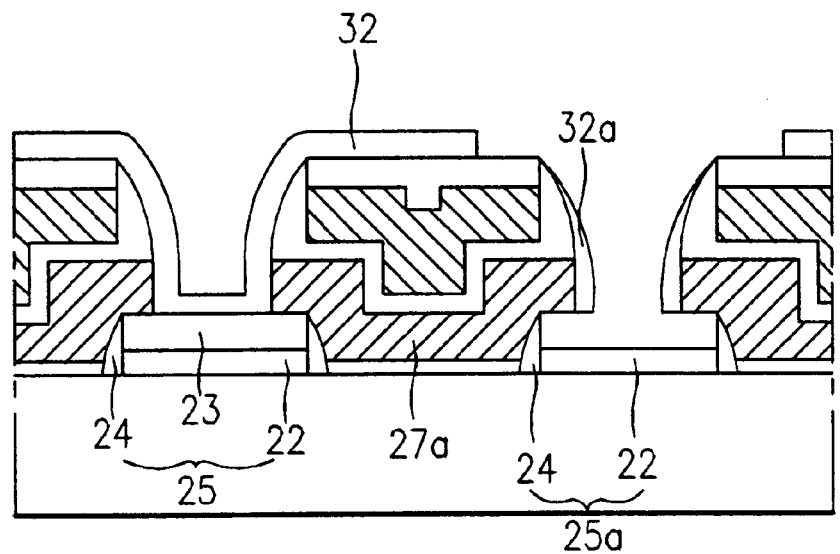

Referring to FIGS. 5j and 6j, with the photoresist pattern PR serving as a mask. the second interlevel insulating film 32 is etched-back to form third sidewall spacer 32a on the second sidewall spacers 31 and on both sides of the floating gate 27a. That is to say, the second interlevel insulating film 32 masks every other first isolation region 25.

Figure 5K:
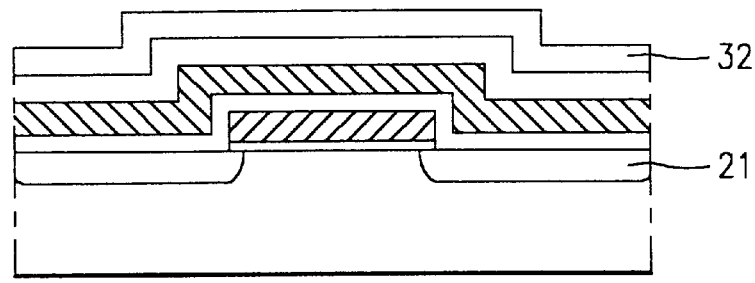

Referring to FIGS. 5k an 6k, the remaining photoresist film PR is removed. Subsequently, the second insulating layer 23 of each of the first isolation regions 25 which are not masked by the second interlevel insulating film 32 is etched to be removed with the third sidewall spacers 32a serving as a mask. As a result, unlike the first isolating region 25, the second isolation regions 25a doesn't have the second insulating layer 23 any longer. At this time, a wet-etch is applied to removing the second insulating layer 23, so that the floating gate 27a overlapping the second insulating layer 23 is exposed.

Figure 5L:
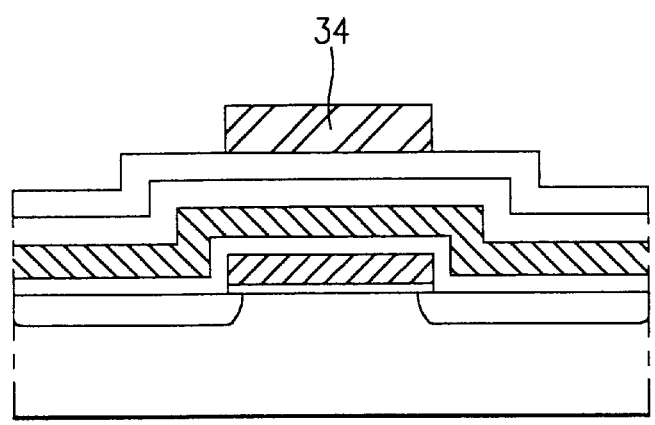
Figure 6L:
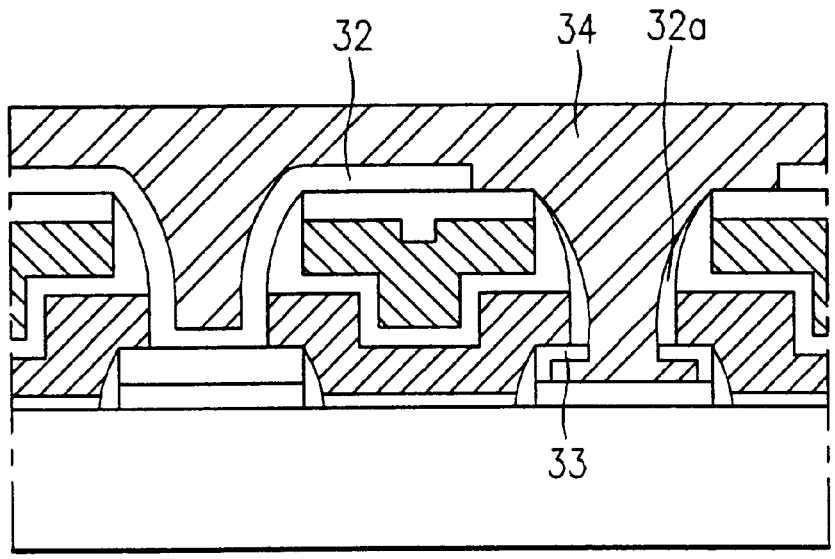

Referring to FIGS. 5l and 6l, an oxide layer 33 is formed to cover the exposed floating gate 27a and the first sidewall spacers 24. Thereafter, a polysilicon layer used as an erase gate is deposited and then is selectively patterned to form an erase gate line 34 over the floating gate 27a, at a right angle to the control gate line 29. At this time, the erase gate line 34 has a narrower width than the floating gate 27a and is formed on the first insulting layer of the second isolation regions 25a, as well. In other words, at the placement of the second insulting layer 23 removed, the polysilicon layer used as the erase gate line 34 is formed which is used as a path of electrons on programming and erasing at the floating gate 27a. That is, on programming with regard to the floating gate 27a, electrons are injected at the edge of the second insulating layer 23. In contrast, on erasing with regard to the floating gate 27a, electrons are moved out through the edge of the floating gate 27a to the erase gate line 34.

A flash memory device of the invention and a manufacturing method thereof have various advantages. Since a channel region is located under a control gate and a floating gate, high speed operations can be advantageously achieved. Further, since the traveling direction of electrons on programming is different from that of electrons on erasing, a high programming frequency can be obtained, thus prolonging the life span of a device and improving its reliability.

For programming, electrons are injected by means of an erase gate line, not by means of channel hot electrons, so that the damage of a gate oxide layer can be prevented. The erase gate is formed to be at a right angle to a control gate line, so that it is possible to carry out erasing operations by a sector unit or block unit as well as by a cell unit, thereby improving device performances. Moreover, it is unnecessary to isolate a heavily doped impurity region used as a source from the floating gate, thereby obtaining a higher integration.

It will be apparent to those skilled in the art that various modification and variations can be made in the flash memory device and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A method for manufacturing a flash memory device, the method comprising the steps of:
    forming first and second doped impurity regions in a semiconductor substrate in a first direction and spaced apart from one another by a first prescribed distance in a second direction;
    forming first and second isolation regions on said semiconductor substrate in the second direction to be spaced away from one another by a second prescribed distance in the first direction;
    forming floating gates between the first and second isolation regions and between said impurity regions;
    forming control gate lines between said first and second isolation regions and overlapping said floating gates, said control gate lines being formed in the second direction; and
    forming an erase gate line over the floating gates in the first direction, wherein the first direction is at a substantially perpendicular angle to the second direction.

2. The method of claim 1, wherein said control gate lines and said erase gate line have a narrower width than said floating gates.

3. The method of claim 1, wherein a gate insulating layer is further formed between the floating gates and the semiconductor substrate, a first interlevel insulating film is formed between the control gate lines and the floating gates, and an insulating layer is formed between the erase gate line and the control gate lines.

4. The method of claim 1, wherein each of said floating gates overlaps the first and second isolation regions by a prescribed area.

5. The method of claim 1, wherein the step of forming first and second isolation regions comprises:
    successively forming an oxide layer and a nitride layer on a prescribed portion of the semiconductor substrate; and
    forming first sidewall spacers on both sides of the oxide layer and the nitride layer.

6. The method of claim 1, wherein sides of the floating gates are formed to overlap the first and second impurity regions.

7. The method of claim 1, wherein the step of forming the isolation regions comprises the steps of:
    depositing and selectively patterning first and second insulating layers on the semiconductor substrate to be substantially perpendicular to the doped first and second impurity regions; and
    forming sidewall spacers on both sides of the first and second insulating layers.

8. The method of claim 1, further comprising a step of forming first sidewall spacers, each formed above the floating gates and on both sides of the control gate lines.

9. The method of claim 1, further comprising a step of one of programming and erasing at least one of the floating gates by moving electrons through one of the erase gate lines.

10. The method of claim 7, wherein said first and second insulating layers are made of different materials having different etch rates, respectively.

11. The method of claim 7, wherein said second insulating layer is removed by wet etching.

12. The method of claim 7, wherein said first and second insulating layers are a nitride layer and an oxide layer, respectively.

13. The method of claim 7, wherein said sidewall spacers are made of a material having substantially the same etch rate as the first insulating layer.

14. The method of claim 7, wherein said first and second insulating layers are an oxide layer and a nitride layer, respectively.

15. The method of claim 12, wherein a thermal oxidation process or a chemical vapor deposition (CVD) process is applied to the semiconductor substrate, so as to form the oxide layer.

16. The method of claim 8, further comprising a step of forming second sidewall spacers, each formed between one of said first sidewall spacers and one of said erase gate lines.

17. The method of claim 9, wherein the programming step includes moving electrons through an edge of the second isolation region.

18. The method of claim 17, wherein one of the programming and erasing steps includes moving electrons through an edge of the floating gate overlapping the second isolation region.

19. A method for manufacturing a flash memory device, comprising the steps of:
    forming doped impurity regions in a semiconductor substrate spaced away from one another;
    forming isolation regions on the semiconductor substrate spaced away from one another;
    forming floating gates between the isolation regions and between the impurity regions;
    forming control gate lines between the isolation regions and overlapping the floating gates; and
    forming erase gate lines at a substantially perpendicular angle to the control gate lines.

20. A method for manufacturing a flash memory device, comprising the steps of:
    forming doped impurity regions in a semiconductor substrate;
    forming isolation regions on the semiconductor substrate;
    forming floating gates between the isolation regions and between the impurity regions;
    forming control gate lines between the isolation regions and overlapping the floating gates;
    forming first sidewall spacers above the floating gates and on both sides of the control gate lines;.

* * * * *